United States Patent
Bernardini et al.

(10) Patent No.: US 9,814,212 B2
(45) Date of Patent: Nov. 14, 2017

(54) ELECTRONIC DEVICE, SYSTEM COMPRISING SUCH DEVICE AND METHOD FOR AUTOMATIC DETECTION OF CAGE CONDITION AND PRESENCE

(71) Applicant: TECNIPLAST S.P.A., Buguggiate (IT)

(72) Inventors: Pietro Bernardini, Corsio Della Valle (IT); Giovanni Malnati, Malnate (IT)

(73) Assignee: TECNIPLAST S.P.A., Buguggiate (IT)

( * ) Notice: Subject to any disclaimer, the term of this patent is extended or adjusted under 35 U.S.C. 154(b) by 0 days.

(21) Appl. No.: 14/348,311

(22) PCT Filed: Sep. 28, 2012

(86) PCT No.: PCT/EP2012/069196
§ 371 (c)(1),
(2) Date: Mar. 28, 2014

(87) PCT Pub. No.: WO2013/045620
PCT Pub. Date: Apr. 4, 2013

(65) Prior Publication Data
US 2014/0232381 A1  Aug. 21, 2014

Related U.S. Application Data

(60) Provisional application No. 61/541,326, filed on Sep. 30, 2011.

(51) Int. Cl.
*G01N 27/72* (2006.01)
*G01R 33/12* (2006.01)
(Continued)

(52) U.S. Cl.
CPC .......... *A01K 1/031* (2013.01); *G01R 29/0814* (2013.01)

(58) Field of Classification Search
CPC .............. G01N 2223/405; G01R 33/12; A61B 2019/5251
(Continued)

(56) References Cited

U.S. PATENT DOCUMENTS 5,477,210 A * 12/1995 Belcher .............. G08B 21/0263
324/207.26
6,325,022 B1 * 12/2001 LaFeber, III ............. A01K 1/03
119/708
(Continued)

FOREIGN PATENT DOCUMENTS

EP 2499907 A1 9/2012
EP 2499908 A1 9/2012
(Continued)

OTHER PUBLICATIONS

International Search Report and Written Opinion for PCT/EP2012/069196, filed Sep. 28, 2012 (dated Jan. 30, 2013).

*Primary Examiner* — Giovanni Astacio-Oquendo
(74) *Attorney, Agent, or Firm* — LeClairRyan, a Professional Corporation

(57) ABSTRACT

The present invention concerns an electronic device, particularly for detecting and control the environment of an animal housing, such as a cage, thus being able to automatically detect and control animal's immediate environment. Furthermore, the present invention also concerns a system comprising such device or a plurality of devices, and a method for automatic detection of cage condition and presence. The device, the system and the method according to the present invention allow to detect the presence and several parameters of the cage environment without interfering with the inside of the cage.

10 Claims, 13 Drawing Sheets

(51) Int. Cl.
*A01K 1/03* (2006.01)
*G01R 29/08* (2006.01)

(58) Field of Classification Search
USPC ............................... 324/228, 200, 219, 226
See application file for complete search history.

(56) References Cited

U.S. PATENT DOCUMENTS

| | | | |
|---|---|---|---|
| 6,367,418 B1* | 4/2002 | Ulman | A01K 1/031 |
| | | | 119/54 |
| 6,392,547 B1* | 5/2002 | Stewart | G08B 13/1427 |
| | | | 340/539.23 |
| 6,520,120 B1* | 2/2003 | Arnold | A01K 13/001 |
| | | | 119/678 |
| 6,625,934 B1* | 9/2003 | McGrath, III | 52/27 |
| 6,998,980 B2 | 2/2006 | Ingley et al. | |
| 7,389,744 B2 | 6/2008 | Zhang et al. | |
| 8,446,277 B2* | 5/2013 | Frederick | F16P 3/14 |
| | | | 340/539.21 |
| 8,797,166 B2* | 8/2014 | Triener | 340/573.1 |
| 2003/0024482 A1* | 2/2003 | Gondhalekar et al. | 119/417 |
| 2008/0063561 A1* | 3/2008 | Van Hooser | A23L 3/3454 |
| | | | 422/37 |
| 2009/0293815 A1* | 12/2009 | Coiro, Sr. | A01K 1/031 |
| | | | 119/417 |
| 2011/0054669 A1* | 3/2011 | Savoia | B25J 15/0253 |
| | | | 700/218 |
| 2013/0228134 A1* | 9/2013 | Conger | A01K 1/0047 |
| | | | 119/417 |

FOREIGN PATENT DOCUMENTS

| | | |
|---|---|---|
| JP | 55-131663 | 9/1980 |
| JP | 2008-527975 | 7/2008 |
| WO | WO 2006/065773 | 6/2006 |

* cited by examiner

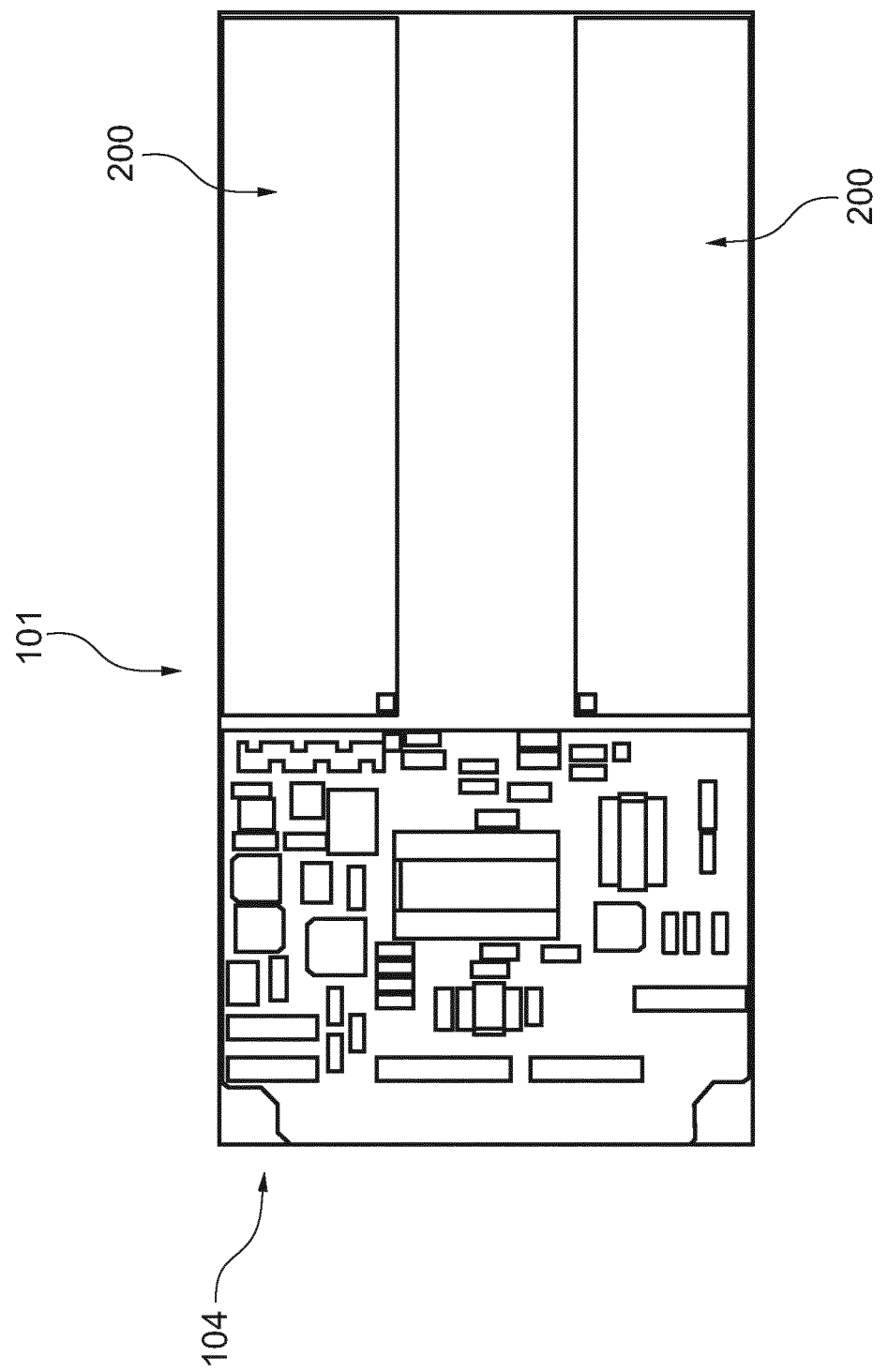

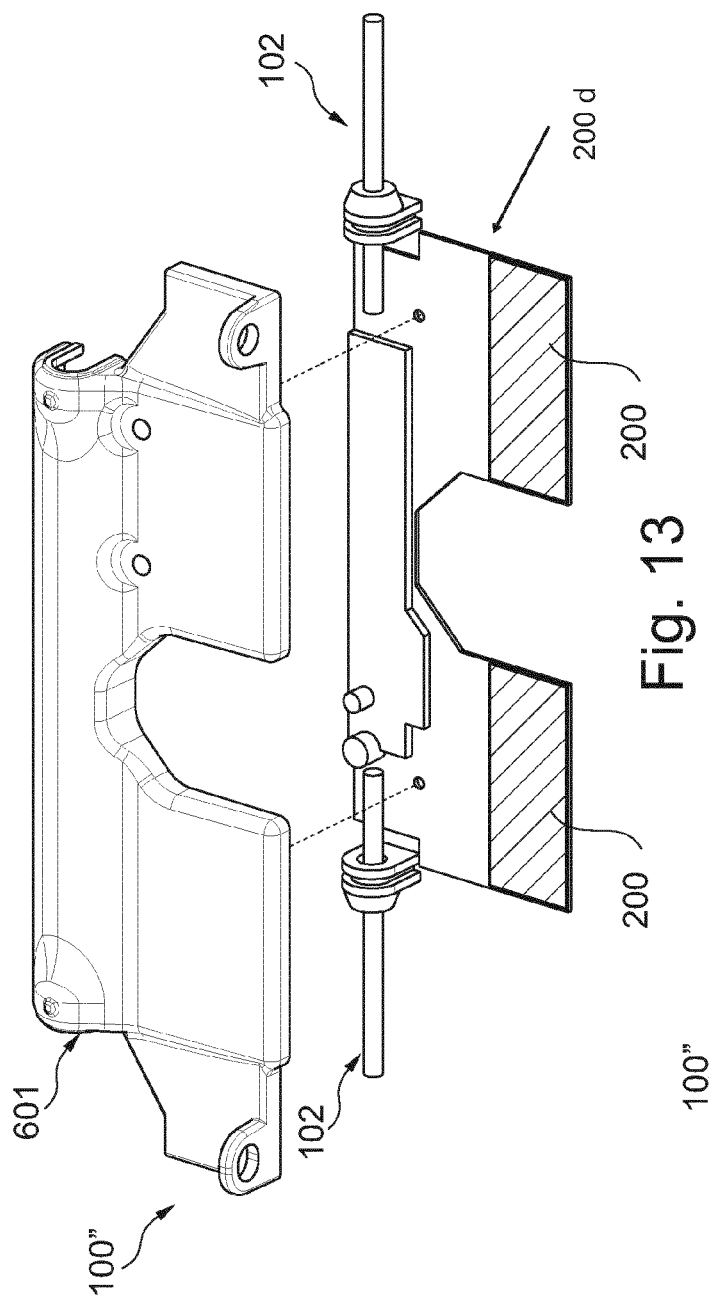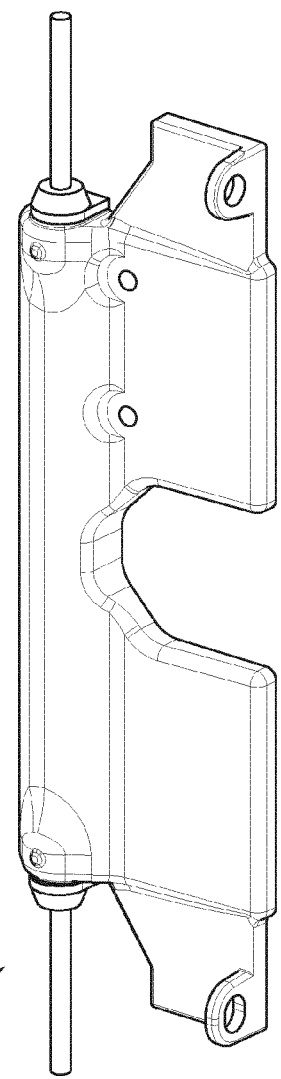

ELECTRONIC DEVICE, SYSTEM
COMPRISING SUCH DEVICE AND METHOD
FOR AUTOMATIC DETECTION OF CAGE
CONDITION AND PRESENCE

This application is a national stage application under 35 U.S.C. §371 of PCT Application No. PCT/EP2012/069196, filed Sep. 12, 2012, which claims the benefit of U.S. Provisional Patent Application Ser. No. 61/541,326, filed Sep. 30, 2011, all of which are hereby incorporated by reference in their entirety.

FIELD OF THE INVENTION

The present invention concerns an electronic device, particularly for detecting and control the environment of an animal housing, such as a cage, thus being able to automatically detect and control animal's immediate environment. Furthermore, the present invention also concerns a system comprising such device or a plurality of devices, and a method for automatic detection of cage condition and presence.

BACKGROUND

In the field of animal management, specifically that of laboratory animals such as rodents, environment inside the cages must be tightly controlled to prevent contaminations of the animals by the external environment and/or contamination of the environment and humans by the animals.

Research animals are becoming more valuable because many disease models are expensive and time consuming to develop on animals and some animals may have gone through longitudinal studies accumulating valuable long term data from experiments thus making them extremely critical to basic science research and medical device and drug development programs.

Most research institutions would invest significant amount of resources to safe keep these valuable animal assets. A vivarium facility, comprising the shelving storage and the cages, is a repository where researches store their valuable animals. Individually ventilated cages ("IVC") and rack systems are widely used for housing laboratory animals that enable a plurality of such animal cages to be arranged in a industrious and efficient manner. These systems are designed for providing a highly consistent environment across all cages on each rack.

Cages are typically suspended from the shelf above the cage via a rim or flange that extends outward from the top of the cage and fit into specific rack runners to firmly block cages when completely slid into these rack slots.

Nonetheless, it is not uncommon that one single rack would house animals from multiple study protocols that may have different controls and environmental requirements. Therefore, there is a need for a highly adaptable caging system that can provide researchers and vivarium management flexibility to accommodate such emerging market needs on a single rack system.

Furthermore, some vivarium facilities support "long term studies", where a "long term studies" is defined as a research study that involves research animals monitored by recording devices and necessary equipment to collect data either continuously or at pre-set intervals from animals or from sensing instruments surrounding the animals. The duration of such studies may last for a workday (at least 8 hours) to the maximum lifespan of the animals being studied.

Cage level monitoring devices have been evaluated and sometimes adopted on limited scale for decades to provide precise measures and controls of microenvironment and sometimes even the animals inside. The basic concept of an operant cage is almost a century old. However, deploying active monitoring on a large and industrious scale has been inefficient and challenging because of cost and reliability issues. One challenging issue is to satisfy stringent cleaning requirements of monitoring and control equipment on large scale. Some electronic equipment is hard to decontaminate. Some may not withstand harsh cleaning agents or methods. More and more sophisticated animal models are developed with animals that have immune deficiency, multiple diseases, etc. making these animals extremely sensitive to the cleanliness of the cage micro-environment. A lot of resources are dedicated to minimize cross-contaminations between cages and cohorts of animals from different study protocols. Therefore, there is an unmet need for an efficient way to keep monitoring equipment and devices around and near each cage clean. Many modern vivarium facilities use sophisticated technologies to provide consistently high quality of care for these valuable animal assets.

Besides housing, another area is in providing quality drinking water to every cage with methods such as water packs, automated filled water bottles, and automatic watering systems. These watering methods typically are very reliable. However, their failures can cause cage flooding which may lead to animal distress or even death from hypothermia or drowning. Therefore, there is a market need for a highly reliable and specific flooding detection and warning system to safeguard against potentially devastating loss of animal assets. Additionally, there is an unmet need for a system suitable to automatically detect the bedding conditions in order to constantly control the environment of the cage.

In the field of Lab Animal Management, another very important area is to track all the cages and clear assignments to staff's different responsible. Many electronic systems have been developed for tracking and reducing the wasting time for locating cages and available slots on cage racks. These systems are frequently based on particular software where users have to insert cage position and related information, usually in a time spending back-office routine.

Lab animal housing requirements are higher with the need for devices to offer monitoring and control of micro-environment with objectives for both reducing research variations by employing strategies to provide consistent micro environment of the cage, and to monitor micro-environment and detect unexpected issues early so that expensive and valuable animal models are not lost. This allows the outbreaks prevention and a more active and reliable control of the cage/animals parameters. As research animals becoming more valuable, researchers are increasingly more interested in using monitoring equipment to extract useful data in a home cage environment. To increase capacity and quality for monitoring these valuable research animals, there are some basic needs such as water quality, safety to animals, and a direct control of the cage environment by monitoring both excessive water indicating cage flooding, and the bedding condition providing objective metrics for determining when to replace soiled bedding.

Some patents (Zhang U.S. Pat. No. 7,389,744, Ingley U.S. Pat. No. 6,998,980) have disclosed ways of detecting these micro-environmental parameters using special means inside the cage (i.e. humidity sensors, etc.) or more in general the cage itself has to be modified in comparison with the original design to support the usage of internal means. This can cause stress on the animals and/or the possibility to modify the behavior of the animals themselves therefore, adversely affecting the result of an experiment.

SUMMARY OF THE INVENTION

It is therefore the aim of the present invention to provide an electronic device suitable to automatically detect cage condition and presence without interfering with the environment of the cage.

According to the present invention, is therefore provided an electronic device able to detect a plurality of parameters, including presence of the cage in the proximity of the device, cage environment parameters such as bedding condition, animal's activity and behavior and many other parameters familiar to the expert in the field, without modifying the cage and/or the rack and without interfering with the cage environment.

Additionally, it is also an object of the present invention to provide an electronic system comprising one or more of such electronic devices suitable to automatically detect and monitoring cage condition and presence.

The system performs active monitoring and control of the cage environment, it evaluates the animal activity inside the cage and it can also detect the presence of the cage in the proximity of the electronic device, e.g. at a slot on a cage rack. Another object of the present invention is to provide an electronic device and a system comprising such device that can detect cage conditions, i.e. soaking wet bedding, to promptly detect a cage flooding condition, and overly moist bedding being an indication for changing soiled bedding.

Another object of the present invention is to provide an electronic device and a system comprising such device that can detect the animal activity inside the cage without having any means projecting inside the cage itself.

Another object of the present invention is to provide a method for detecting the presence of the cage in the proximity of a device, e.g. on a cage rack when the device is attached or docked to the rack, and for monitoring the cage condition without having any means projecting inside the cage itself.

According to a preferred embodiment of the present invention, as it will be more precisely described in the following, the electronic device according to the present invention comprises at least a sensor with one or more electrodes and a processing unit that monitors sensor signal and communicates programmed commands to control the environment of at least one cage.

The processing unit also triggers warning signals to alarm appropriate personnel when certain user-defined metrics exceed preset thresholds.

The sensor board detects the cage condition and presence when it is placed in close proximity to a cage and it could be touching or, in a fixed and defined distance from the cage. The sensor may interrogate object(s) remotely and in general does not have to be in contact with the object(s) it measures. The sensor measures and quantifies the dielectric value of the material enclosed in the electro-magnetic field generates by the electrodes.

According to a preferred embodiment of the present invention, in order to maintain constant the distance between the sensor board and bottom of the cage, the sensor board is fixed to special protrusion (legs) of the runners where the cage is slid when it is on the rack structure.

This aim and these objects, and others that will be more clear after the detailed description of a preferred embodiment of the present invention, are achieved by an electronic device and system provided with specially designed features in order to active monitoring and control the micro-environment of the cage, to evaluate the animal activity and to evaluate the presence of the cages on the rack.

DESCRIPTION OF THE DRAWINGS

Further characteristics and advantages of the present invention will become clear from the following detailed description of a preferred embodiment that is merely illustrative and not limitative and is shown in the figures that are attached hereto, in which:

FIG. 2 shows a possible configuration of the electronic device according to the present invention, in which an electric diagram of the electronic unit board is visible;

FIG. 13 shows an exploded view of the electronic device of the present invention according to the third embodiment of FIGS. 11 and 12;

FIG. 14 shows an assembled view of the electronic device of FIG. 13.

DESCRIPTION OF THE INVENTION

Figure 1A:
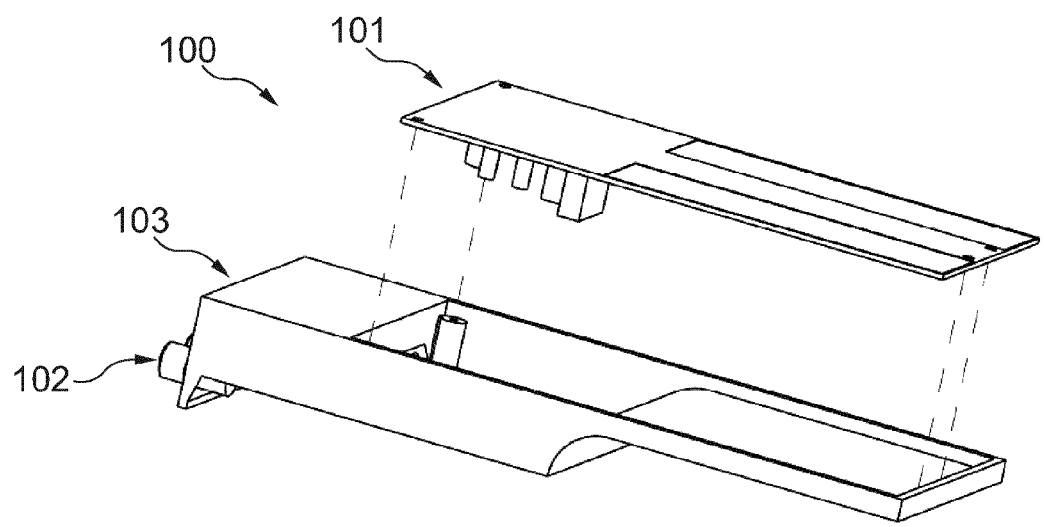
FIG. 1A shows, in an exploded view, a possible configuration of the electronic device according to the present invention, comprising an electronic board unit and a physical cover.
Figure 1B:
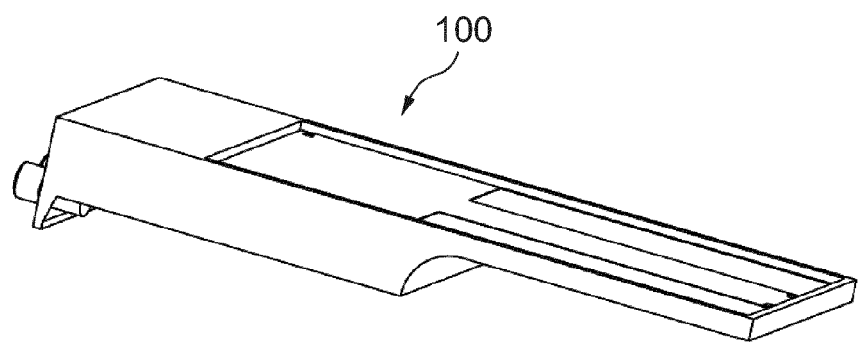
FIG. 1B shows the configuration of FIG. 1A in an assembled view.
Figure 1C:
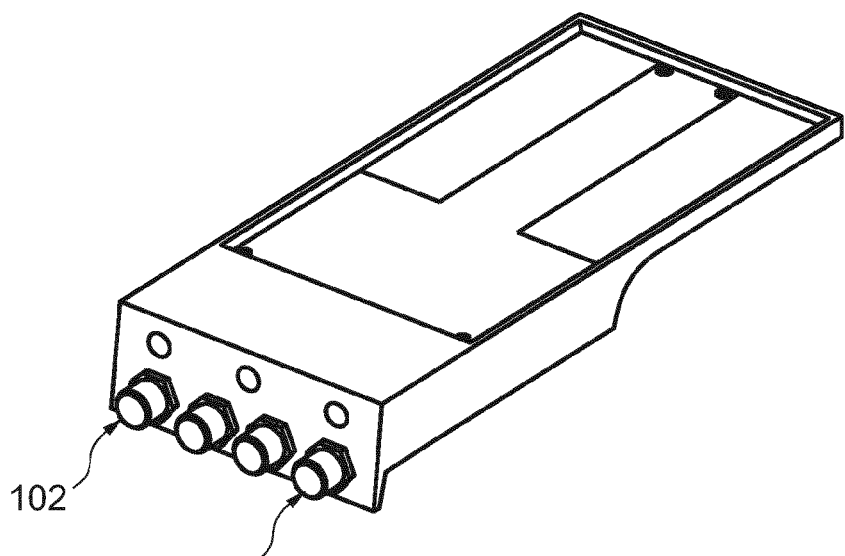
FIG. 1C shows the configuration of FIG. 1B in a different prospective view.
Figure 3:
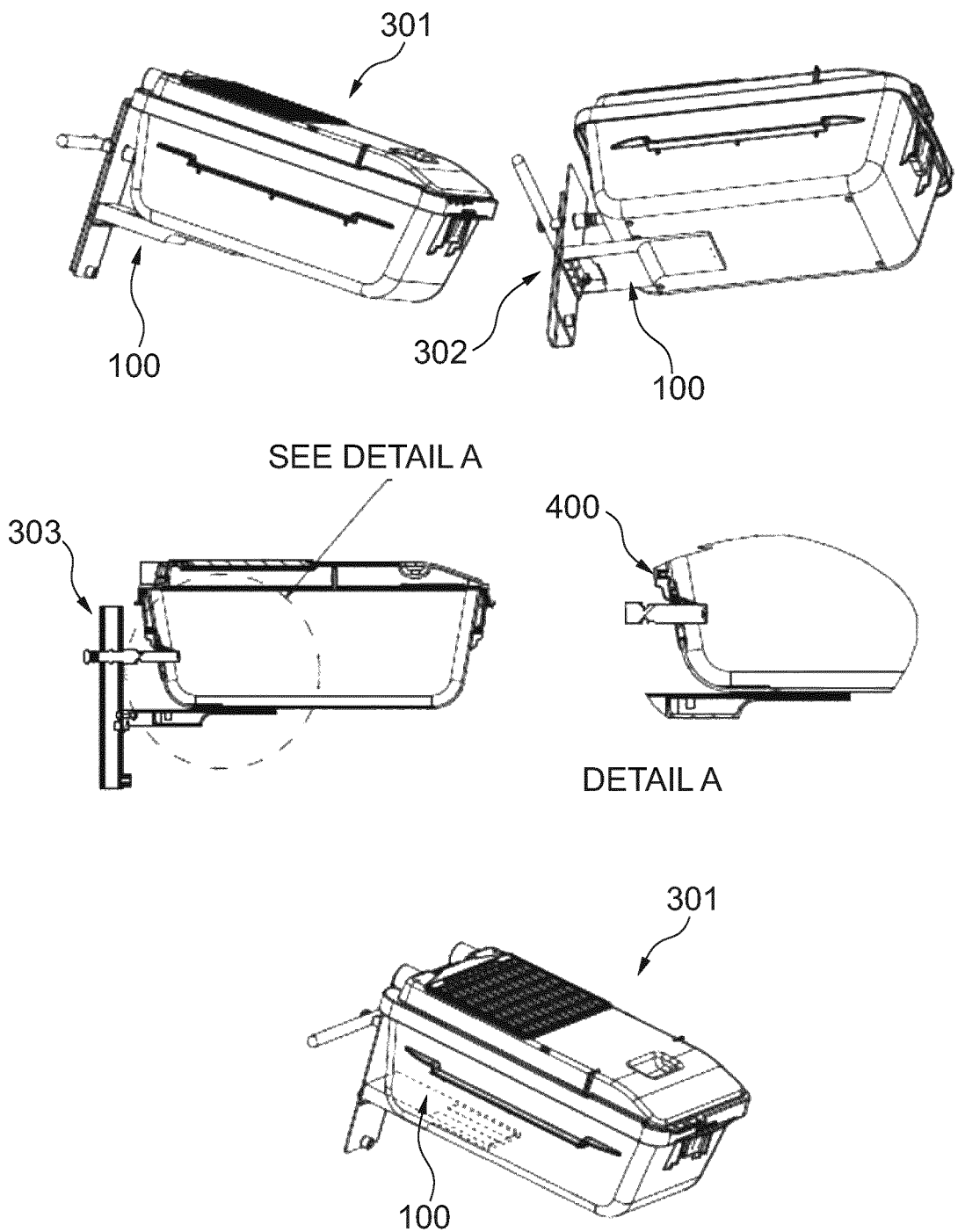
FIG. 3 shows generic views of the cage with the electronic device of the present invention just located below the bottom side, and cross section of a lateral view.
Figure 4:
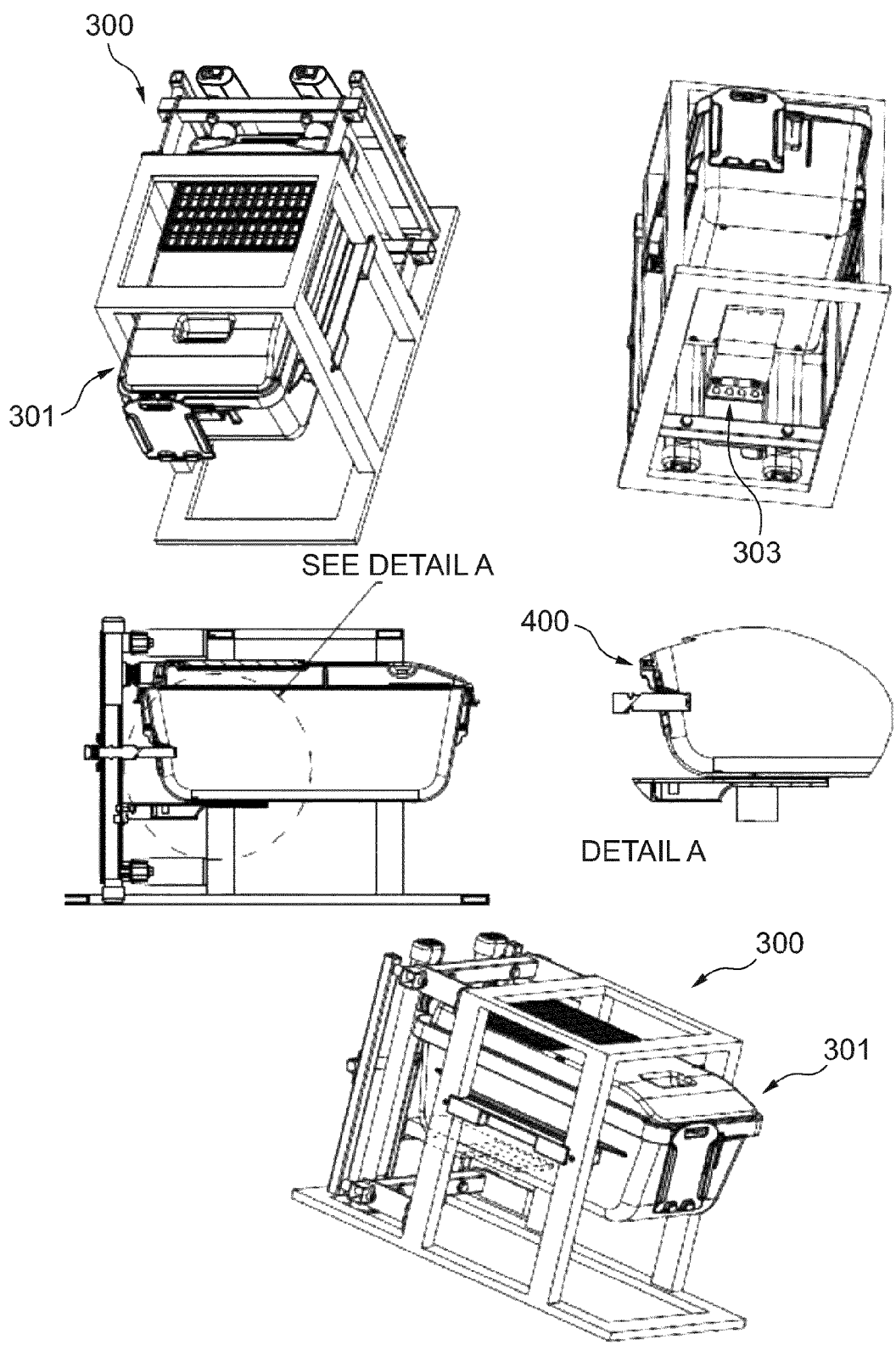
FIG. 4 shows a plurality of views of the cage into a single place-rack specially designed to receive such a cage, wherein the electronic device of the present invention is located below the bottom side of the cage, and cross section of a lateral view.
Figure 5:
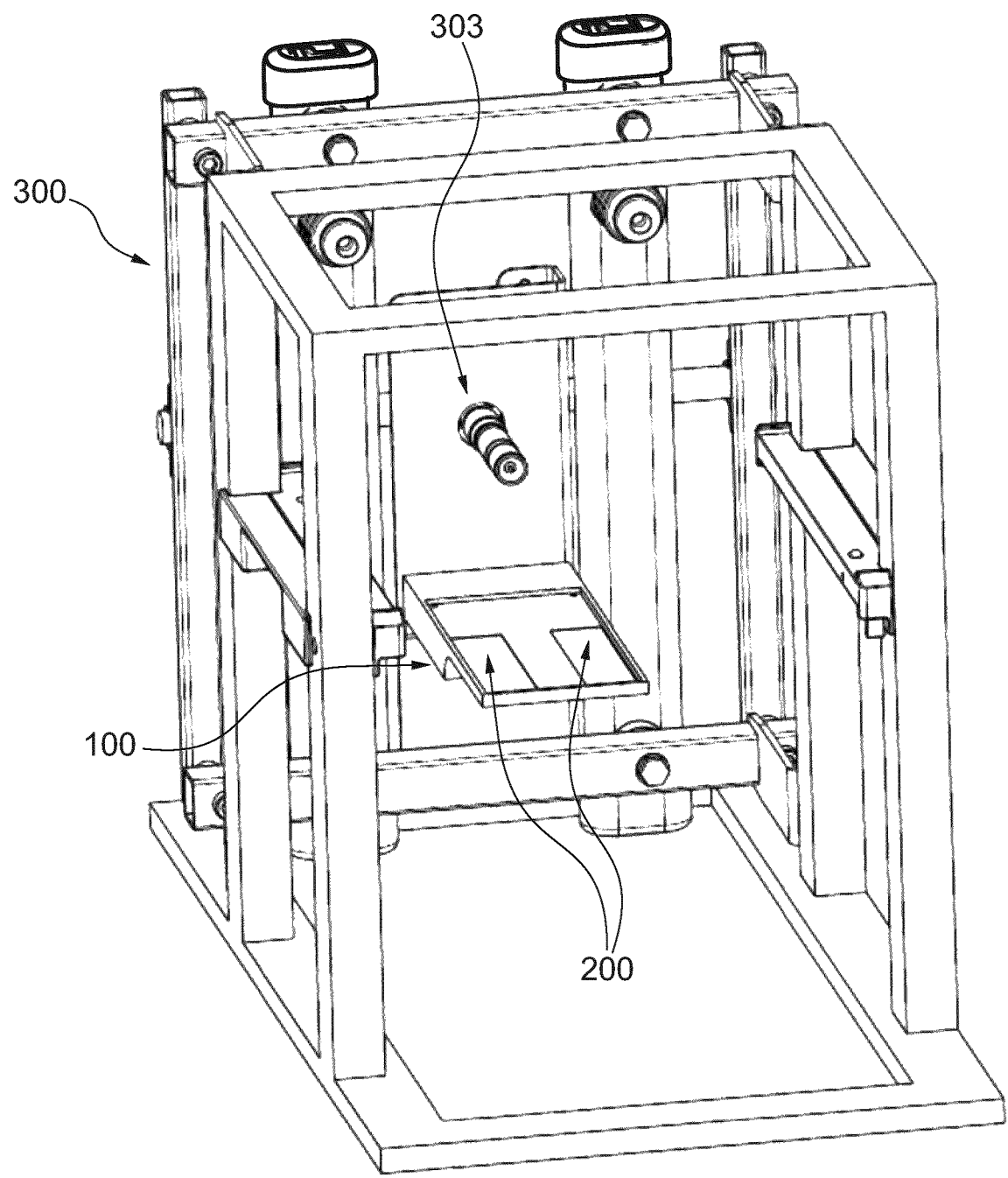
FIG. 5 shows a single place-rack comprising the electronic device according to the present invention.

According to a first embodiment, the electronic device 100 according to the present invention comprises at least a radiating element 200 suitable to radiate an electro-magnetic field into a dielectric, at least a detecting sensor, not explicitly shown in the drawings, connected to said at least a radiating element 200 and suitable to detect the variations of said electro-magnetic field, and at least a processing unit 104, connected to said sensor, which receives the sensor signals.

According to a preferred embodiment of the present invention, illustrated in the mentioned figures, the electronic device 100 according to the present invention comprises an electronic board unit 101, which comprises said processing unit 104 and said at least one radiating element 200, provided with connections 102, that drives said at least one sensor with that at least radiating element 200, and a non-conductive coating material or a physical cover 103 (e.g. plastic holder) where all the electronic components are inserted in order to allow the whole device to be autoclaved.

In another preferred embodiment, the electronic device 100 is enclosed on a plastic case and immersed into a resin in order to be autoclaved without problems. In order to autoclave the device it is necessary to eliminate the gases (i.e. the air) that remains within the case during the assembly process. By completely immersing the sensor in resin it is avoided the unwanted presence of air within the case.

An example of such plastic case is shown in FIGS. 13 and 14, which show respectively an exploded view and an assembled view of the electronic device of the present invention.

The detecting sensor is connected to said at least one electrode 200 that is made of conductive material, i.e. metallic material, powered with alternate current. In a preferred embodiment, said electrode is made by a conductive plate of a capacitor system created by the electrode and the dielectric material between them.

In a more preferred embodiment, the electronic device comprise two electrodes 200. These two electrodes 200 in a certain manner, in order to precisely interrogate the changes in dielectric property detected by the sensor.

The processing unit 104 drives the two electrodes 200 in order to generate a specific electro-magnetic field just above them. This electro-magnetic field intercepts the bottom of the cage just above the electrodes if inserted, otherwise the electro-magnetic field completely closes in open air.

The detecting sensor, receives the signal from said radiating element 200.

The electronic board unit 101 is developed to assess the different dielectric values coming from the sensor and performing several comparison, calculations and transmitting data.

The connections 102 of the electronic device 100 are necessary to transfer data from the electronic board unit 101 to any another electronic system that can interface with the electronic board 102 (i.e. a pc system).

In a preferred embodiment these connections 102 are placed on the lateral part of the physical cover 103, but it is also hereby intended that possible other positions can be used.

It is part of the present invention also the electronic system comprising one or more of said electronic device 100.

A preferred connecting configuration of the electronic system is the daisy chain configuration. All the possible single and independent electronic devices 100 located in all the needed rack slot positions 300 have different electronic addresses and these are connected serially one by one. The initial and final connections are closed to a more general electronic board, i.e. a controller 801, which is part of the system and which supplies power to the electronic device 100 through a bus cable 802 and it controls and stores all the data coming from each single electronic board unit 101, querying all the different electronic addresses using the same bus cable 802.

It is hereby intended that the connection configuration is not limited to a unique solution and it is open to different approaches based on different mechanical constraints coming from the rack structure.

The electrodes or the single radiating means are therefore placed in close proximity to the object(s) the sensor is designed to detect. The optimized location of such sensor depends on the specific detection applications. For example, one convenient location to place the sensor is right underneath a cage for the application of detecting bedding moisture level.

In general those who are skilled in the art can come up with specific methods to achieve a stable and consistent separation between the sensor and the cage to optimize utility. For example, the sensor can be attached or docked to a cage rack where it is placed adjacent to a cage docked to the rack.

The electronic device 100 according to the present invention measures changes in the collective signal from plastic cage and bedding. When cage 301 is inserted into the slot position 300 this becomes the baseline reference for the electronic system. When water level increases, the dielectric value of the material enclosed in the electro-magnetic field generates by the electrodes 200, changes from baseline; such change is sufficiently specific to the water level inside a cage. The electronic device 100 may apply different calculations methods to discriminate between a real flooding alarm and a common worsening condition of the bedding (i.e. accumulating dirt).

As it has been said, a plurality of electronic device 100 according to the present invention can be organized in a system.

In a preferred embodiment, a certain dielectric threshold is stored into the electronic device, e.g. into the processing unit 104 or into the controller 801, as "flooding reference" and every time this is reached at a cage, the "flooding alarm" is generated and such alarm signal can also be used to shut off the water supply to that cage.

Another possible embodiment is that the electronic device 100 calculates the speed of the change of the dielectric value detected and it compares it to a reference speed value stored into itself. If this exceeds the reference value, a "flooding alarm" is generated.

So that, first aim of this device is to detect the bedding condition, in particular with reference to the moisture degree of the bedding, and/or to detect the presence of water in a cage even in the case that the cage is not filled with bedding material.

More in detail, monitoring the dielectric properties of the material above the electrodes is possible to discriminate different situations:
- no cage inserted into a cage rack slot;
- it is inserted into the slot only a plastic cage without bedding;
- it is inserted into the slot a plastic cage with clean and dry bedding;
- it is inserted into the slot a plastic cage with soiled bedding;
- it is inserted into the slot a plastic cage with wet bedding (i.e. flooding condition).

Moreover, the sensor can detect changes in electro-magnetic field associated with general animal activity inside the cage just above the sensor.

More in detail, in a preferred embodiment, the electronic system 100', 100" of the present invention is well fixed to the special protrusion (legs) 303 coming from the above mentioned cage runners 304. This configuration allows to maintain a constant distance between the electronic system 100', 100" and the bottom of the cage 301.

In a second preferred embodiment, the electronic device of the present invention is well fixed to the rack structure 302 and it is located just below the cage when this is inserted into the rack.

The electronic system may work at different frequencies (from DC to AC) with the same set of electrodes to measure different aspects of the condition side of the cage.

In its simplest form as described below, dielectric properties can be used to measure humidity condition of the bedding, i.e. to monitor the moisture and, therefore, the dirtiness of the bedding. Additionally, the dielectric properties can be used to measure and promptly detect excessive water being accumulated inside the cage.

Moreover, open air has a different dielectric compared to the dielectric of a plastic cage and since the electro-magnetic field, generated by the electrodes 200, is just few inches above the electrodes themselves, the electronic device 100, 100', 100" is able to discriminate if the cage is inserted into the corresponding slot where the electronic device is fixed or not.

One specific embodiment of the electronic device 100", shown for example in FIGS. 13 and 14, uses two electrodes 200*d* which could be in the form of rectangular plates and enclosed on a specific plastic case 601 with a semicircular cavity in the middle, that lay on the same plane, spaced by approximately 8 inches one to each other and generating an electro-magnetic field that flows through the bottom of the cage in the region of the automatic watering system device.

The reason of having this specific semicircular cavity is due to possible water leakage coming from the above auto watering valve when the cage is not inserted into the rack structure. In this way, small water drops will fall directly on the ground and will not fall over the electronic sensor, affecting values of the electro-magnetic field.

Note that cage flooding usually happens when there is a sudden increase in the amount of water inside the cage due to malfunction of the drinking water source.

One aspect of the invention here is to measure the dielectric properties of the bedding. A bedding related specific value of this dielectric with a certain amount of water would indicate a possible cage flood.

To illustrate the effects of this invention, experiments have been conducted by comparing the effects of dry and wet bedding inside a cage equipped with electrodes. With dry bedding, the measured dielectric is about 1.54-1.62 pF, depending upon the bedding type (corn cob, alpha dry, etc.) while soaking wet bedding, the dielectric value is about 2.04-2.20 pF. The difference in the measured values is about 30-40% therefore very significant, and the bedding condition can be easily detected.

Additionally, measuring of the dielectric properties can be used not only to detect a flooding condition of the cage itself but also provide a very reliable indication of the bedding condition.

In fact, it is common for vivarium facilities to schedule their periodic changing of the bedding, usually every fourteen days for IVC. Therefore, they use to change the bedding of the cage, i.e. they remove the cage from the rack and move the animals from the old cage to a new one, filled with dry bedding material, at a predetermined term-time, regardless of the real condition of the bedding. Such unguided process could generate a large volume of waste bedding and consume significant amount of resources. Therefore, a more objective means for monitoring bedding condition could reduce wasting resources.

The dielectric properties change associated with bedding condition derives from the accumulation of minerals typically associated with urine and waste materials from animals.

An increased level of dirty bedding is associated to an increased level of minerals and this causes a different dielectric bedding value calculated by the sensor. The dielectric properties of the bedding can be measured at a predetermined time interval, e.g. every half an hour, thus avoiding the possibility to altering the cage conditions, even if the voltage is very low, 3.3 Volts and the frequency is around 30 KHz.

As explained above, flooding condition is automatically defined when dielectric properties of the bedding overcomes a specific and bedding related reference value.

Figure 6:
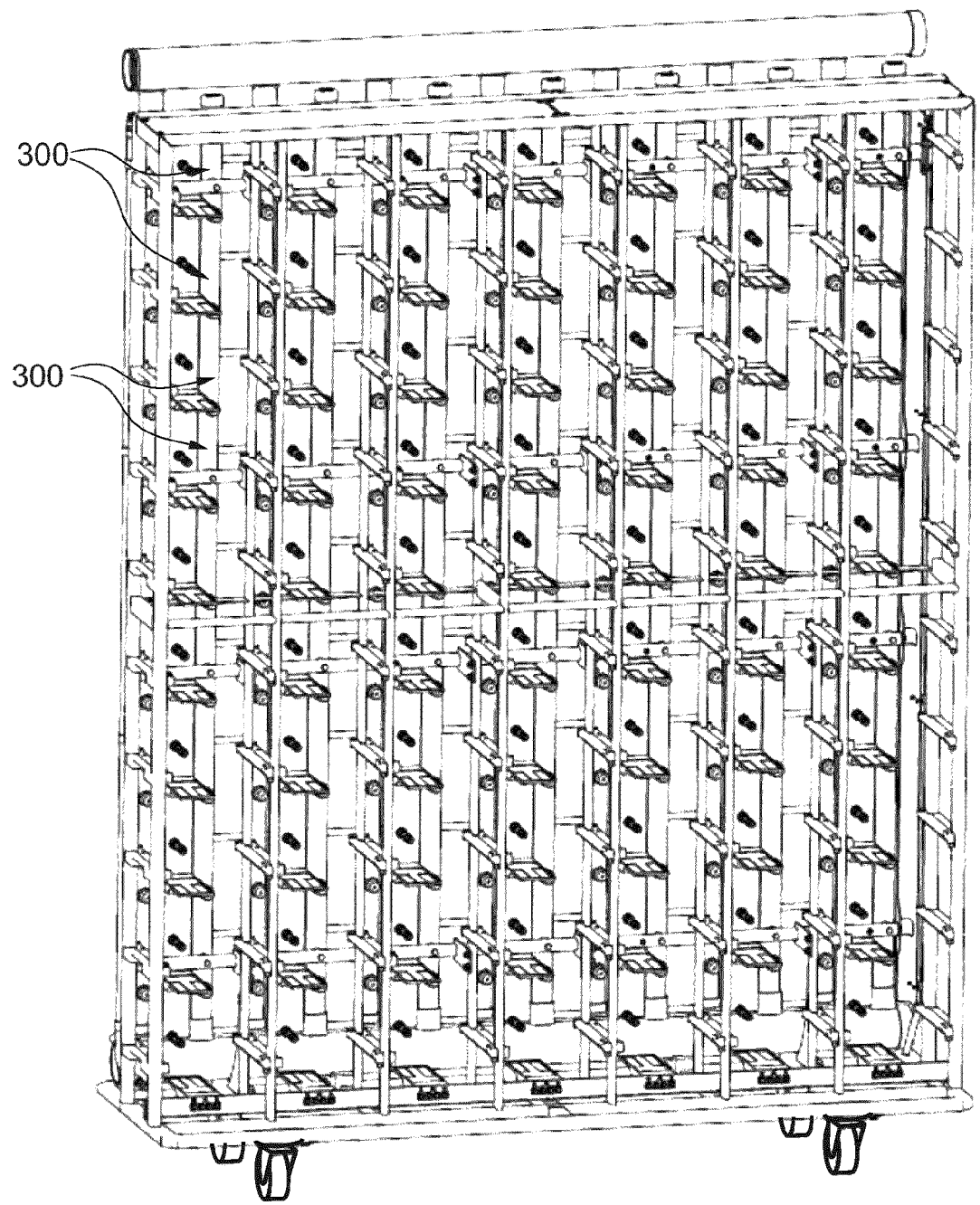
FIG. 6 shows a complete rack with all the cage slot positions equipped with an electronic device according to the present invention.

As an example of possible way of working of the system with a cage in a specially designed single place station or rack, reference is made to FIGS. 2 and 6, where the cage 301 is placed on a station or a rack equipped with the system in its single place. An automatic watering device 303 is inserted in the cage itself, thus allowing the watering of the animals.

The cage is therefore provided with an opening 400 suitable to receive the watering device 303.

As per the description above, the electronic board unit 101 with the sensor that drives at least two electrodes 200 is placed externally at the cage floor, below this watering device. The electrodes are made of highly conductive materials (e.g. metal) that allow generating an electro-magnetic field between them, just few inches above them and these are inserted into a specific holder 103 that can resist typical rack cleaning processes.

Another possible example is related to a water spillage from a cage bottle 500. The electronic system detects the higher quantity of water into the bedding because this amount of unneeded water modifies the dielectric properties of the bedding.

It is clear the scope of this invention that detects different dielectric values based on the different properties of the material enclosed into the electro-magnetic field, generated by the electrodes.

Figure 7:
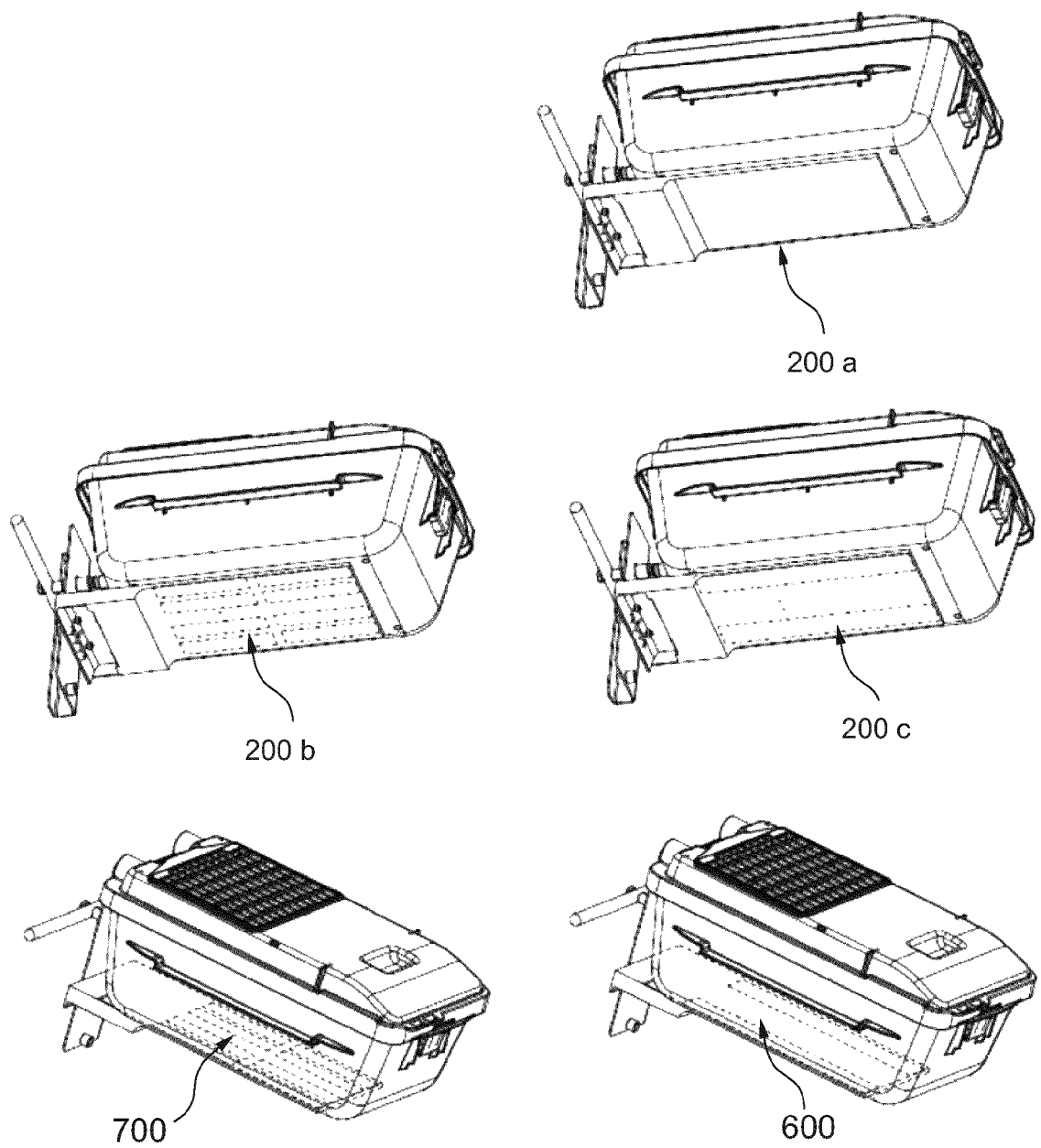
FIG. 7 shows a plurality of views of a cage provided with the electronic device of the present invention according to several different embodiments.
Figure 8:
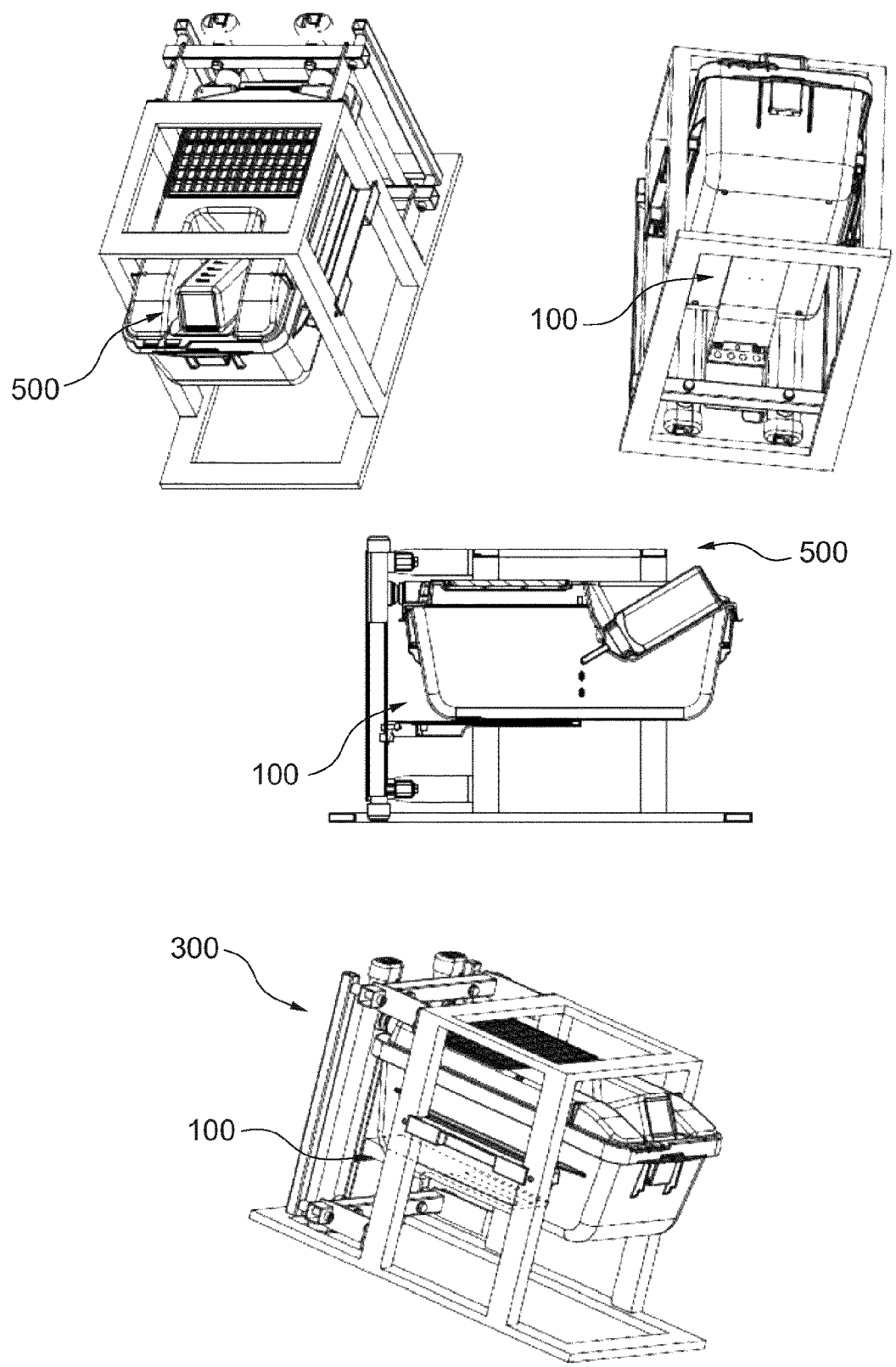
FIG. 8 shows a generic views of a cage equipped with water bottle with the electronic device according to the present invention just located below the bottom side, and cross section of a lateral view.
Figure 9:
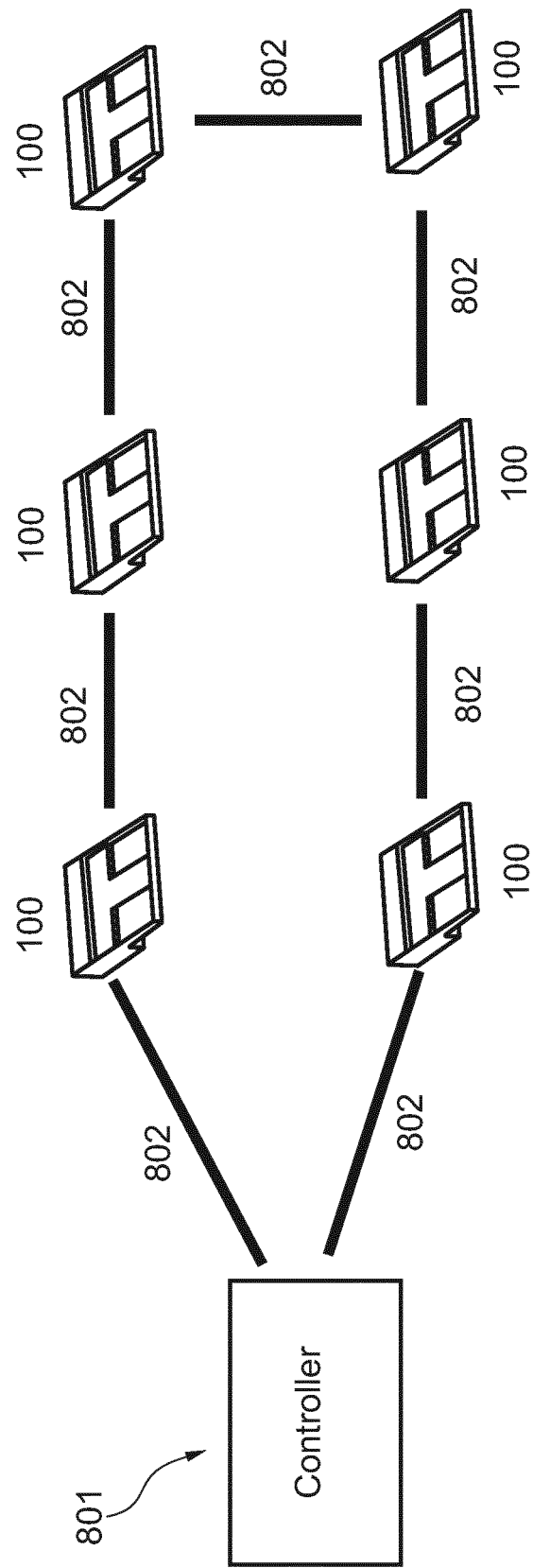
FIG. 9 shows a block diagram of the electronic system of the present invention, which comprises the electronic device of the present invention.
Figure 10:
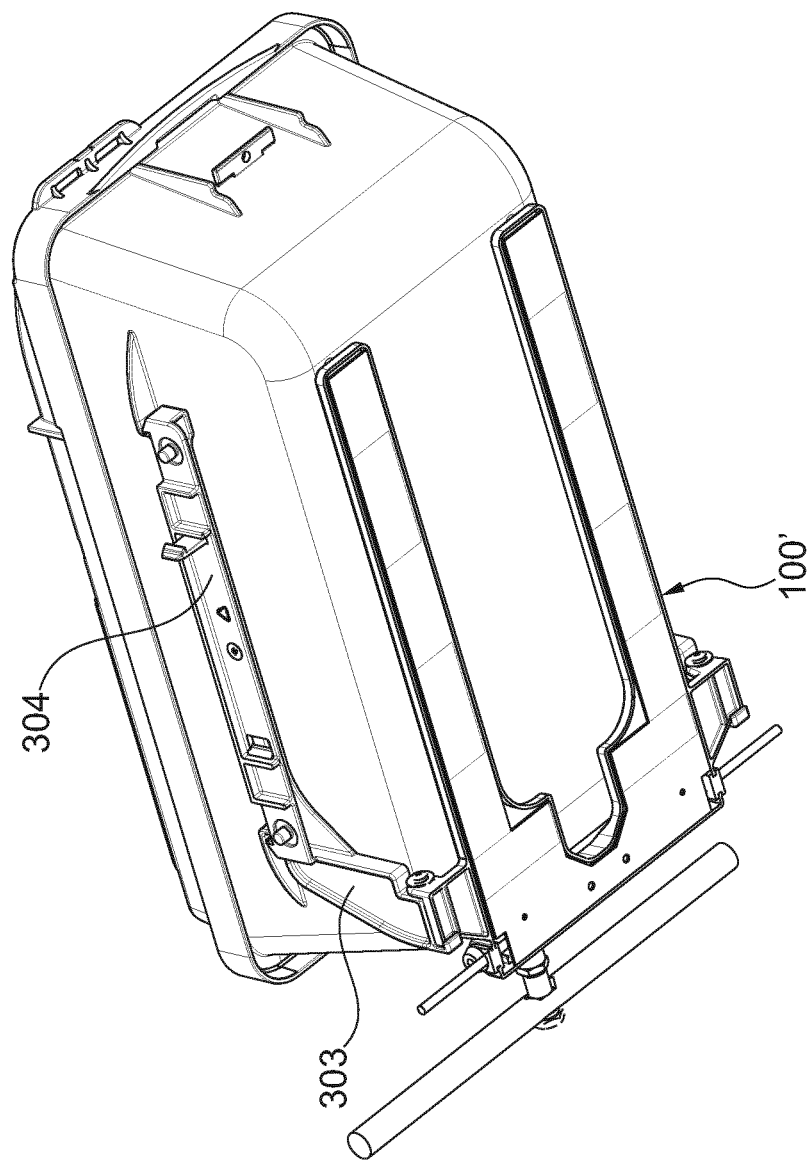
FIG. 10 shows a further possible configuration of the electronic device of the present invention according to a second embodiment.
Figure 11:
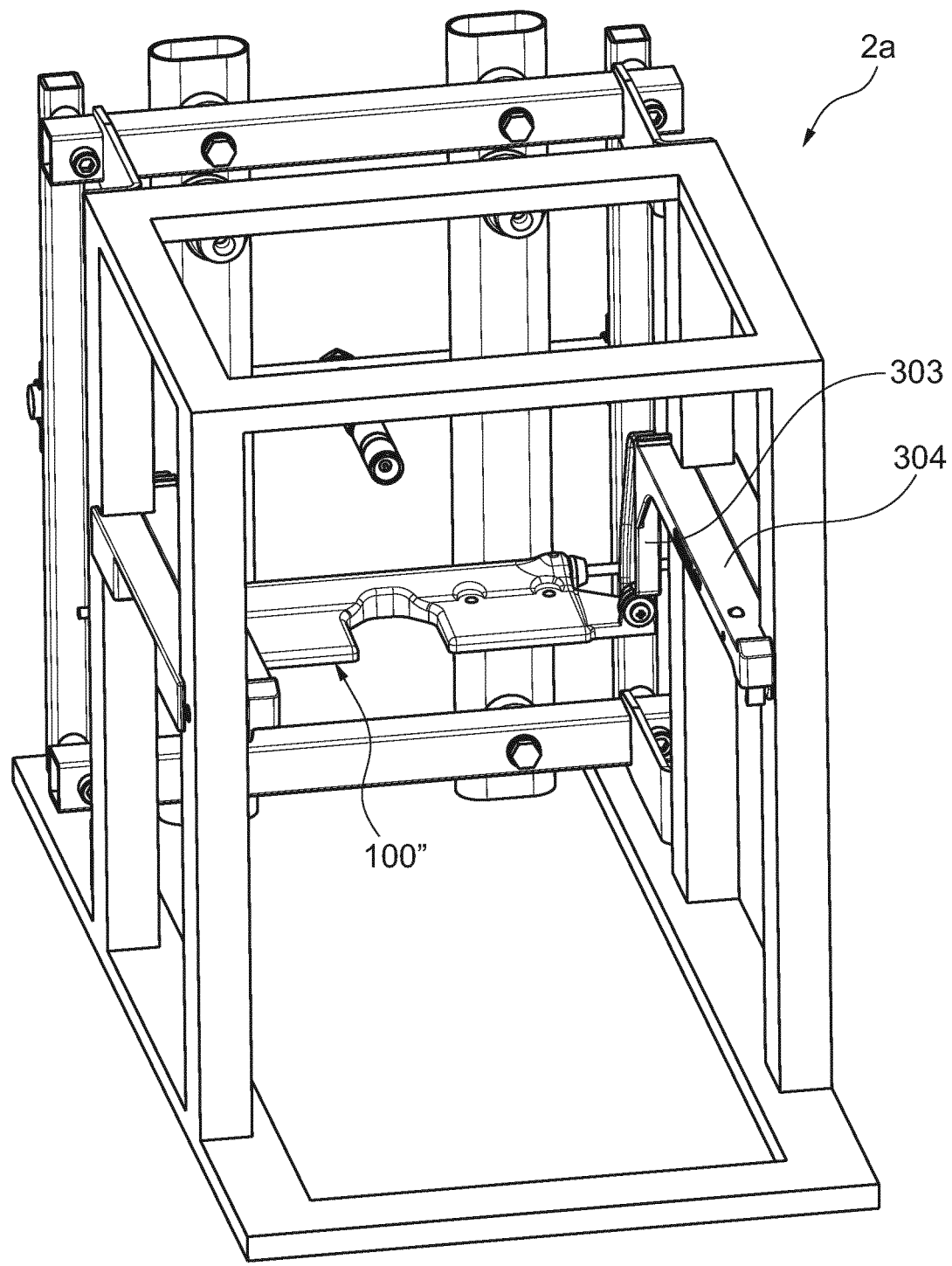
FIG. 11 shows a single place-rack comprising the electronic device of the present invention according to a third embodiment, the single place-rack being provided with special runners to maintain constant the distance between electronic system and bottom of the cage.
Figure 12:
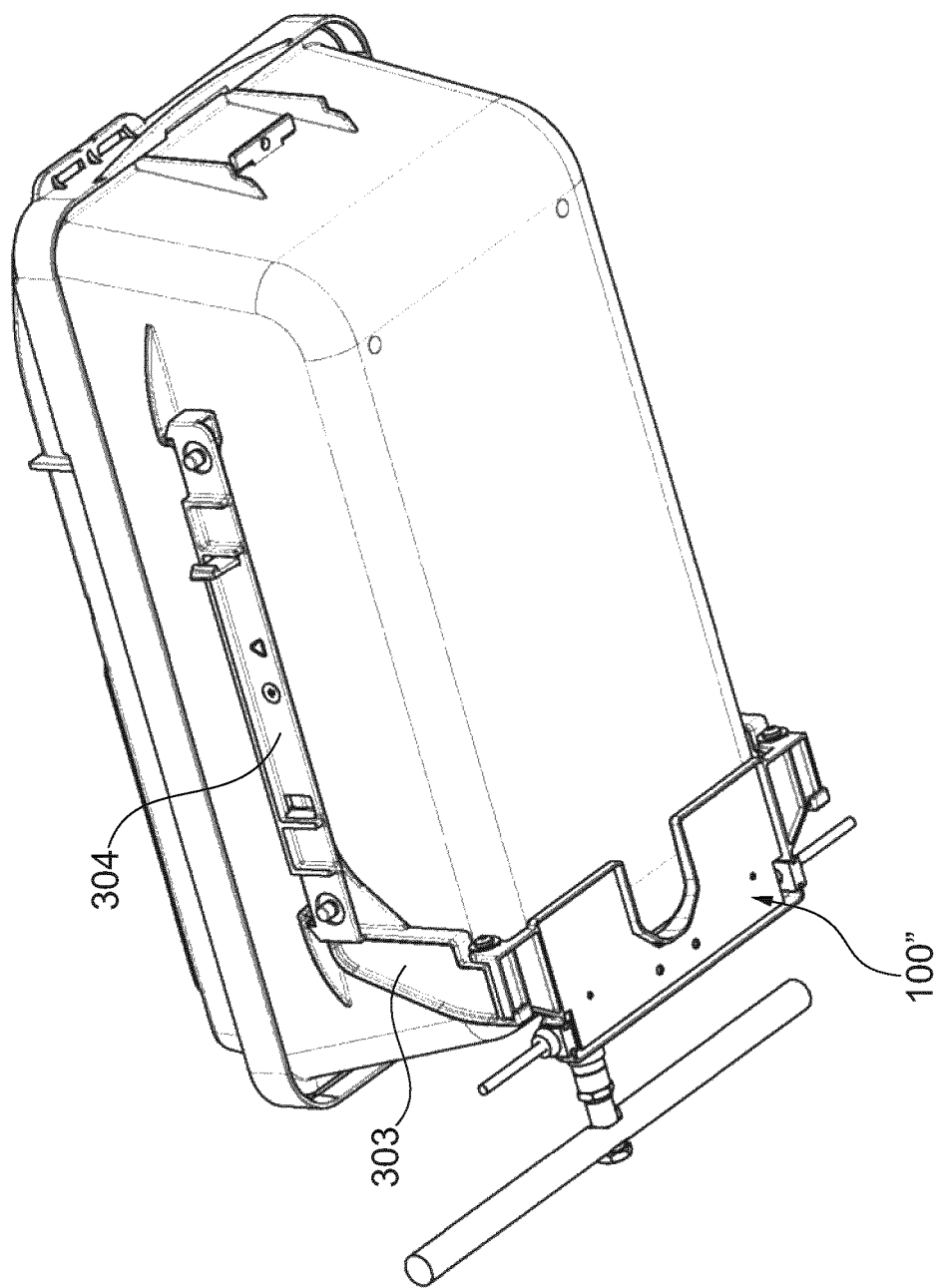
FIG. 12 shows a bottom view of the electronic device of the present invention according to the third embodiment of FIG. 11 associated to the runners.

More in general, the electrodes 200 of the radiating element have a certain length and are placed strategically to optimize the sensitivity and specificity of the parameters of interest for measurements. With reference to FIG. 7, wherein several alternative embodiments of the electrodes are shown, they may have even a length, in the longitudinal direction of the cage, that can completely span the cage bottom dimension 200*a*, 200*c* or it can have a U-shaped design 200*d*, as shown in FIG. 14 wherein a U-shaped cover 601 is also provided to cover the electrodes. The U-shaped design of the electronic device 100" is particularly effective in order to avoid water drops coming from the auto watering valve going over the electronic system when the cage is not in place on the rack slot.

Another embodiment is to have multiple electrodes 200*b*. One arrangement is, for example, to have four electrodes, each placed close to one corner of the cage. This arrangement would allow for a better spatial mapping of the wetness inside cage. This could potentially compensate for potential issues such as the cage bottom not perfectly flat or uneven distribution of bedding effecting dielectric properties.

The electronic board unit 101 has a control unit that calculates and monitors the dielectric properties of the bedding into the cage.

Another embodiment is to measure presence of food inside a hopper. The sensor in this case would be placed right above the hopper, or top of a cage. As the feed level goes down in the hopper, the sensor interrogates the average dielectric sign of the feed pallets with air gaps. As the feed level goes down, the sensor detects higher level of air thus providing a way to quantify the feed level in the hopper or as a proxy for quantifying animal food consumption.

Expanding on this embodiment, a sensor can be developed so that it has two sets of electrodes that are designed to detect, one set to monitor the bedding in the cage above the senor, and another set to monitor the feed level in the cage hopper beneath it. The processing unit 104 is designed to use basically one sensor to achieve monitoring of more than one cage.

Calculating dielectric properties does not have to run continuously but at a sampling rate (duty cycle) that is meaning to obtain the desired information on the status of cage.

Setting a specific sampling rate would also allow the user to monitor possible spikes in the dielectric values related to the movements of the animal inside the cage over the electrodes area (where the electro-magnetic field is generated and it is more sensitive). Animals contribute to the dielectric value in a certain way that does not affect the discrimination between soiled cage and flooded cage because the dimension of the animals cannot span the whole area immersed into the electro-magnetic field.

Working with the same principle, the presence of the cage into its slot of the rack can be detected just calculating the dielectric comprised within the electrodes. If the cage is not inserted into the rack, the dielectric value calculated by the system is the reference open air dielectric value. This can be easily inserted into the system as a reference value.

Using a specific software that collects all the information coming from each single system fixed to the all the rack of the facility, it is possible to have a full recap of how many cages are inserted into all the racks in a certain time. Moreover, assigning this presence of cage to a specific workgroups and storing these data it is possible to provide a full inventory.

It has therefore been shown that the electronic system according to the present invention achieves the purpose and the objects proposed.

It will be apparent to the person skilled in the art that various modifications can be conceived and reduced to practice without departing from the scope of the invention.

Therefore, the scope of the claims is not limited to the illustrations or the preferred embodiments shown in the description as an example, but rather the claims include all the patentable novelties deriving from this invention, including all the equivalent embodiments for a person skilled in the art.

What is claimed is:

1. An electronic device for automatic detection of a cage condition in a containment cage, the device comprising:
    a radiating element comprising a plurality of electrodes each configured to radiate an electro-magnetic field through a dielectric material located proximate to the radiating element;
    a detecting sensor located external to the containment cage and connected to the radiating element, the detecting sensor configured to detect variations in the electromagnetic field from the plurality of electrodes; and
    a processing unit coupled to the radiating element and the detecting sensor, wherein the processing unit comprises a memory and is configured to be capable of executing programmed instructions comprising and stored in the memory to:
        receive signals about dielectric properties of the dielectric material from the detecting sensor;
        compare the signals about the dielectric properties of the dielectric material received from the detecting sensor against a threshold value; and
        detect the cage condition in the containment cage based on the comparison.

2. The electronic device according to claim 1, wherein the radiating element and the processing unit are provided on an electronic board unit, the electronic board unit being inserted into a case made of non-conductive coating material to allow the electronic device to be autoclaved.

3. The electronic device according to claim 2, wherein the electronic device is immersed in resin in order to avoid unwanted presence of air within the case.

4. The electronic device according to claim 1, wherein the threshold value is associated to corresponding dielectric condition.

5. The electronic according to claim 1, wherein the radiating element has a U-shaped design.

6. A method for detecting a cage condition in a containment cage, the method comprising:
    receiving, by a processing unit, signals from a detecting sensor located external to the containment cage and connected to a radiating element comprising a plurality of electrodes each configured to radiate an electromagnetic field through a dielectric material located proximate to the radiating element, the detecting sensor configured to detect variations in the electro-magnetic field radiated from the plurality of electrodes through a dielectric material located proximate to the radiating element;
    comparing, by the processing unit, the received signals about dielectric properties of the dielectric material to a threshold value; and
    detecting, by the processing unit, the cage condition of the containment cage based on the comparing.

7. The method according to claim 6, wherein the detecting sensor is configured to detect the variations in the electro-magnetic field from the plurality of electrodes periodically with a predetermined period T.

8. The method according to claim 6, wherein the threshold value is determined by radiating the containment cage, previously positioned in the proximity of the radiating element, the containment cage having a known environmental condition to associate each known environmental condition to a corresponding reference value.

9. The method according to claim 6, wherein the threshold value corresponding to an absence of the containment cage is determined by radiating the electro-magnetic field without positioning the containment cage in proximity of the dielectric material.

10. The method according to claim 6, wherein the detecting sensor is fixed to special protrusions of cage runners in order to maintain a constant distance between the detecting sensor and the containment cage.

* * * * *